United States Patent
Yonehara

(10) Patent No.: US 8,203,233 B2
(45) Date of Patent: Jun. 19, 2012

(54) PWM CONTROL APPARATUS AND METHOD FOR PWM CONTROL

(75) Inventor: Satoshi Yonehara, Chita-gun (JP)

(73) Assignee: Denso Corporation, Kariya (JP)

( * ) Notice: Subject to any disclaimer, the term of this patent is extended or adjusted under 35 U.S.C. 154(b) by 374 days.

(21) Appl. No.: 12/657,276

(22) Filed: Jan. 18, 2010

(65) Prior Publication Data

US 2010/0181846 A1      Jul. 22, 2010

(30) Foreign Application Priority Data

Jan. 19, 2009   (JP) .................................. 2009-008656

(51) Int. Cl.
    *H02J 3/14*    (2006.01)
(52) U.S. Cl. ......................................................... 307/31
(58) Field of Classification Search ............... 307/11–41
    See application file for complete search history.

(56) References Cited

U.S. PATENT DOCUMENTS 7,023,188 B1 *   4/2006   Rice .............................. 323/271
2007/0092264 A1   4/2007   Suzuki et al.

FOREIGN PATENT DOCUMENTS

| JP | 08-068796 | 3/1996 |
|----|-----------|--------|
| JP | 09-204230 | 8/1997 |
| JP | 2002-023680 | 1/2002 |
| JP | 2006-174530 | 6/2006 |
| JP | 2007-097071 | 4/2007 |

* cited by examiner

*Primary Examiner* — Rexford Barnie
*Assistant Examiner* — Toan Vu
(74) *Attorney, Agent, or Firm* — Harness, Dickey & Pierce, PLC

(57) ABSTRACT

Each of the rising edges of PWM outputs is arranged for radiation noise reduction, by the assignment of suffix of output priority, by setting the rising edge of the first output at a start time of a cycle time, by evaluating an output margin at the falling edge of the first output relative to a current of the second output, by setting the rising edge of the second output in sync with the falling edge of the first output if the output margin is smaller than the current size of the second output. The same arrangement is used for subsequent outputs to totally reduce the current size in a simplified manner, thereby preventing the power loss and heat dissipation.

5 Claims, 6 Drawing Sheets

US 8,203,233 B2

PWM CONTROL APPARATUS AND METHOD FOR PWM CONTROL

CROSS REFERENCE TO RELATED APPLICATION

The present application is based on and claims the benefit of priority of Japanese Patent Application No. 2009-8656, filed on Jan. 19, 2009, the disclosure of which is incorporated herein by reference.

FIELD OF THE INVENTION

The present disclosure generally relates to controlling of a pulse width modulation for load driving outputs.

BACKGROUND INFORMATION

Conventionally, a radiation noise reduction scheme of pulse width modulation control circuits is proposed from various entities, for example, as disclosed in Japanese patent documents JP-A-H09-204230, and JP-A-2006-174530. More practically, in the first document, the pulse shape of the voltage waveform applied to a gate electrode of the MOS transistor that serves as a PWM driving object is formed in a trapezoid shape or the like for reducing the radiation noise. In the second document, for reducing the radiation noise, the output pulse shape is adjusted to have the synchronization of rising and falling edge timings when two devices are driven by PWM, by devising a phase difference between ON-OFF timings of the two devices.

However, as shown in the first document, when the pulse voltage is formed to have a trapezoid shape, a difficult shape control has to be performed by the PWM control circuit, at the cost of the power loss due to the waveform shaping that leads to heat dissipation. Further, the PWM control of more than three devices is not considered in the disclosure of the second document. That is, the technique in the second document can only be applied to drive only two devices.

SUMMARY OF THE INVENTION

In view of the above and other problems, the present disclosure provides a PWM control apparatus that uses a simplified waveform shaping method for reducing the radiation noise and for preventing power loss and heat dissipation. In another aspect, the presented PWM control apparatus reduces the radiation noise without the number limit of the PWM driving objects.

In an aspect of the present disclosure, the PWM control apparatus for periodically providing pulse outputs as PWM outputs (Pk) for circuit loads, with each of the loads driven by PWM driving scheme in each of multiple channels after generating respectively different PWM outputs for the multiple channels includes: an assignment unit (100) for assigning priority to respective PWM outputs in the multiple channels according to each PWM output current, a first unit (110) (a) for setting, as a start time (R1) of a cycle time T of the pulse output, a rising edge of a first PWM output (P1) that has a top priority assigned by the assignment unit and (b) for setting, as a falling edge (F1) of the first PWM output, at a timing of a pulse width length multiplied by the cycle time of the pulse output (d1T) relative to the start time of the cycle time and (c) for setting, as an output current (I1) of the PWM output, an output margin (i(F1)) at the falling edge of the first PWM output; and a second unit (125 to 170) for setting, as a rising edge (R2) of a second PWM output (P2) that has a second- place priority assigned by the assignment unit, (a) the falling edge of the first PWM output if the current (I2) of the second PWM output is smaller than the output margin (i(F1)) at the falling edge (F1) of the first PWM output, or (b) the start time of the cycle time if the current of the second PWM output is greater than the output margin at the falling edge of the first PWM output.

In this manner, the rising edges of the first and second PWM outputs (P1, P2) are arranged according to the pulse width, and resulting total current value from the two PWM outputs are reduced. That is, in other words, temporal current change has a lower peak value for the purpose of reducing the radiation noise. Therefore, the waveform shaping in the course of generating the PWM outputs can be saved, and/or the waveform shaping for the purpose of reducing the radiation noise can be simplified, if it is necessary. Further, the power loss due to the waveform shaping can be prevented, with the advantageous effects of preventing the heat dissipation from the power loss.

BRIEF DESCRIPTION OF THE DRAWINGS

Objects, features, and advantages of the present disclosure will become more apparent from the following detailed description made with reference to the accompanying drawings, in which.

DETAILED DESCRIPTION

An embodiment of the present invention is explained as follows based on the drawings. In each of the following embodiments, like parts have like numbers.

(First Embodiment)

Figure 1:
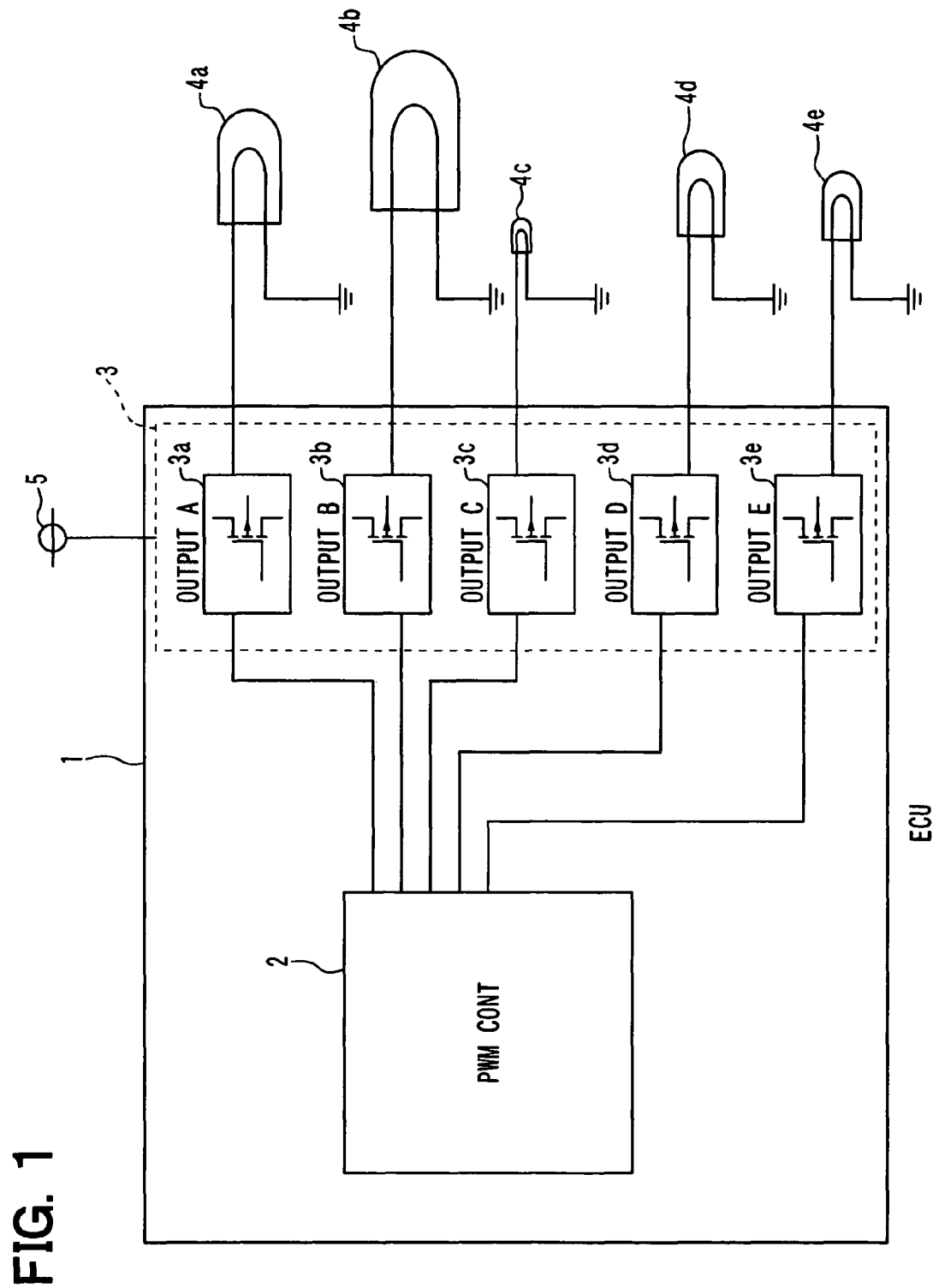
FIG. 1 is a block diagram of a total configuration of a PWM control apparatus in an embodiment of the present invention.

FIG. 1 is a block diagram of a total configuration of a PWM control apparatus in a first embodiment of the present invention. The PWM control apparatus is formed by an ECU 1, and includes a PWM control circuit 2 and a switch circuit 3 driven by the control circuit 2, together with other components. Each of the switches 3a to 3e in the switch circuit 3 is controlled by the PWM control circuit 2 for the purpose of controlling each of circuit loads 4a to 4e.

The PWM control circuit 2 includes a microcomputer having a CPU, a ROM, a RAM, an input/output, with other parts. The control circuit 2 executes PWM control according to programs and various data stored in the ROM and the like. More practically, multiple output channels of the PWM control circuit 2 respectively generate an output of PWM control, and each of the switches 3a to 3e is turned ON and OFF according to the outputs from output channels. For example, five switches 3a to 3e made from MOS transistors, i.e., semiconductor switching elements, are included in the switch circuit 3 of the present embodiment, and intermittent pulse voltages from the PWM control circuit 2 are applied as gate voltages to the MOS transistors. When the pulse voltage from the PWM control circuit 2 is "high" level, the MOS transistor is turned on. When the pulse voltage from the PWM control circuit 2 is "low" level, the MOS transistor is turned off. The pulse width (i.e., duty cycle) of the pulse voltage is modulated for performing the PWM control.

In other words, by performing the PWM control, electricity supply time for each of the loads 4a to 4e is controlled through the switches 3a to 3e. Further, the electricity is supplied to each of the loads 4a to 4e from the same power source such as a battery 5. In the present embodiment, each of the loads 4a to 4e is assumed to be a bulb respectively having a different power consumption specification, or is assumed to be a bulb having the same power consumption specification with the light intensity control variably according to the supplied power. Thus, when each of the switches 3a to 3e is turned on, the electricity is supplied to the bulb that serves as the loads 4a to 4e, and the bulb is turned on. In consideration of respectively different power supply amounts to respective bulbs, due either to respectively different power consumption specifications of those bulbs or to the light intensity control having respectively different adjustment values, the supplied power to the respective bulbs is controlled by the PWM control. The supplied power for each of those bulbs (i.e., the loads 4a to 4e) is determined based on the electric current supplied from the switches 3a to 3e and the supply time of the electric current. That is, the PWM outputs for each of the loads 4a to 4e is determined by the current and the duration of the supply time of the current.

In this case, the bulb is used as the load of the PWM control. However, other kinds of load such as a motor or the like may also be considered as an object of the PWM control. Therefore, if the motor is controlled by the PWM control, the number of rotation of the motor can be controlled.

A switch ON-OFF timing setting method performed by the PWM control circuit 2 is now explained. By controlling the ON-OFF timings of the respective switches 3a to 3e, rising edges and falling edges of the PWM outputs are controlled.

The outputs from the PWM control circuit 2 to the loads 4a to 4e are denoted as outputs A to E, and the current and the supply time (i.e., the pulse width) of the current for those outputs A to E are explained in details.

Figure 2:
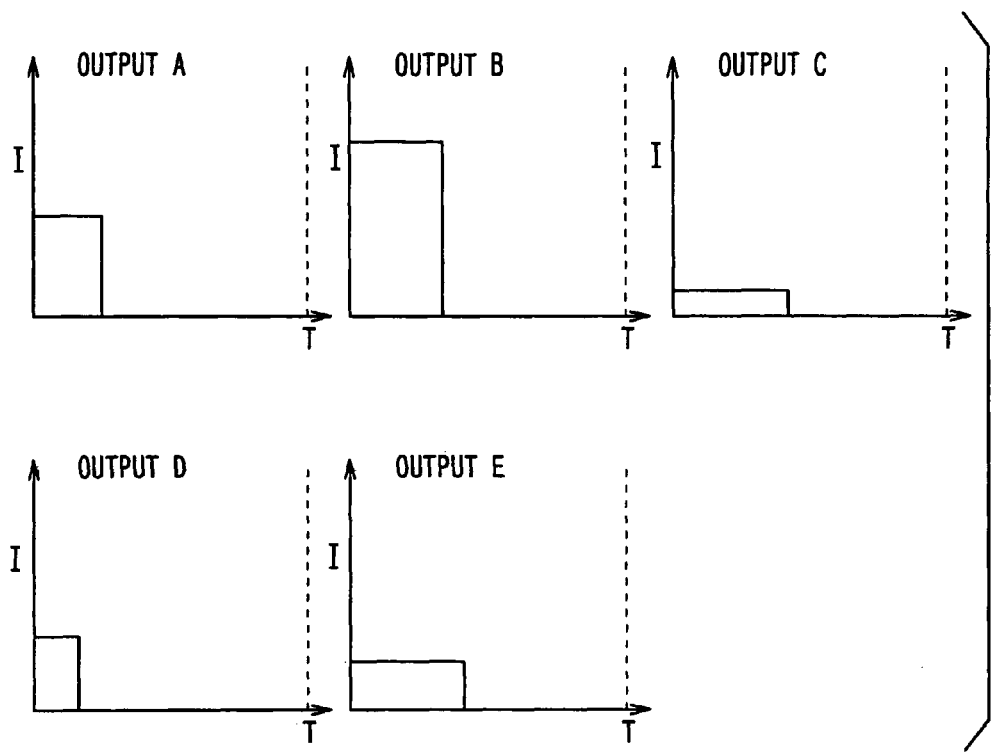
FIG. 2 is an illustration of output waveforms of PWM outputs.

Based on the outputs A to E, priority of rising edge determination orders of PWM outputs for the loads 4a to 4e is determined. For example, if the waveforms of the outputs A to E in one cycle time T are specified as shown in FIG. 2, the priority of determination orders is defined according to the current. That is, the highest priority is assigned to the output B, and then subsequent priorities are assigned to the output A, to the output D, to the output E, and the lowest priority to the output C.

In FIG. 2, all loads 4a to 4e are assumed to be driven by the PWM outputs at the same time. However, if not all of the loads 4a to 4e are driven at the same time, the priority is assigned to only the loads that are driven at the same time. Further, the current is defined as such in a stable state, and not as that of transitional states such as the rising edge or the falling edge. That is, for example, the current is defined as a 100% duty of the loads 4a to 4e. This is used for determining the priority. In this case, the 100% duty current is predefined according to the loads 4a to 4e and other factors such as connected resistors and the like. Therefore, those factors may be stored in the PWM control circuit 2 in advance. Further, if two or more outputs A to E have the same current, the longer pulse width output may have the higher priority.

Figure 3:
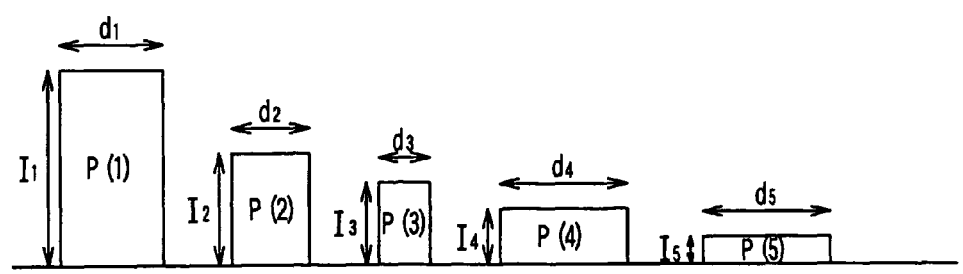
FIG. 3 is an illustration of output waveforms in an order of priority.

Then, as shown in FIG. 3, a suffix k is assigned to each of the PWM outputs according to the priority. By assigning the suffix k, the outputs are identified as output P(k), with the current Ik and the duty cycle (i.e., the current supply time) dk. In the present embodiment, there are five outputs A to E. Therefore, the suffix k takes integer values from 1 to 5. After the assignment of the suffix k, the rising edges of the PWM outputs are determined.

The PWM output is controlled in view of the following concern. That is, at the time of switching on and off of the switches 3a to 3e, the greater the total PWM output value at the moment of switching is, the greater the voltage change due to switching becomes, thereby leading to the greater switching noise emission. In other words, the total PWM output value is preferably controlled to have a smaller value by the arrangement of the rising edges of the respective PWM outputs.

Figure 4A:
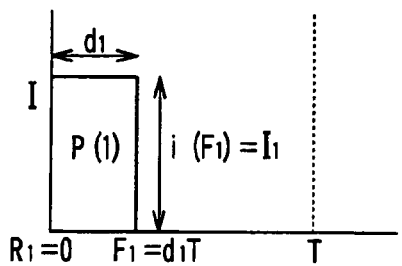
FIGS. 4A and 4B are illustrations of arrangements of PWM outputs in an order of priority-reflecting suffix.
Figure 4B:
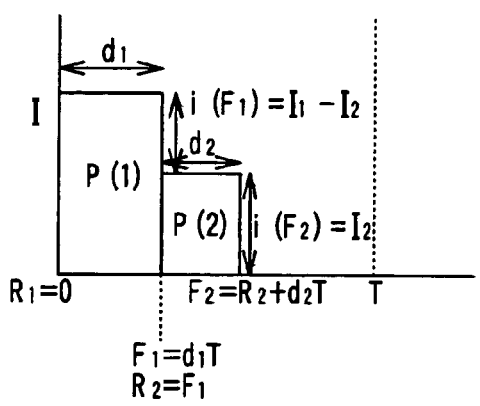
Figure 4B:
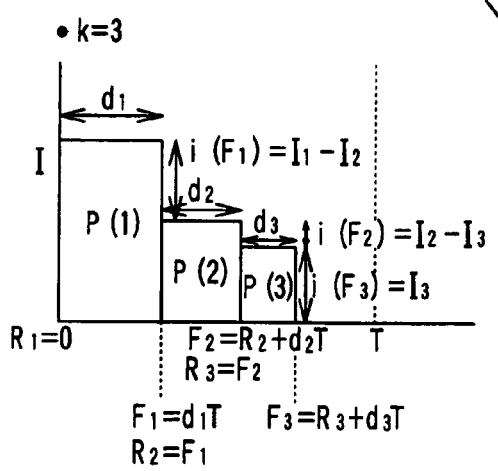
Figure 4B:
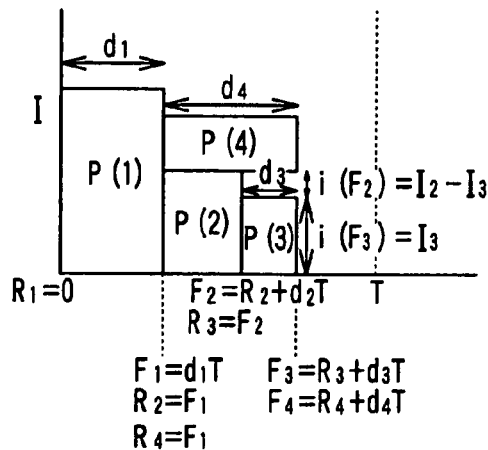
Figure 4B:
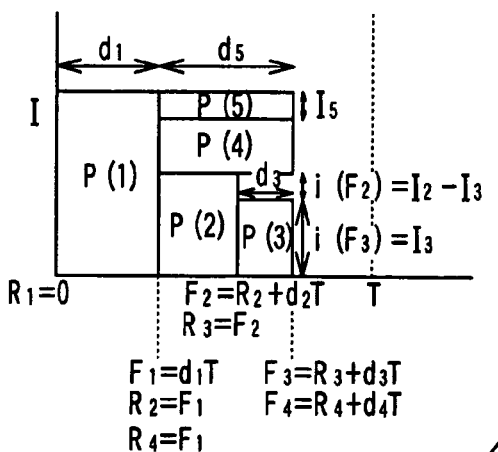

The basic principle for implementing the above idea is explained step by step in the following:

i) the rising edge of the output P(1), which has the highest priority, is set in the first place, as shown in FIG. 4A, ii) whether or not the output P(2) is allocatable after the output P(1) is determined, as shown in a case of k=2 in FIG. 4B, iii) if P(2) is allocatable after P(1), the rising edge of P(2) is set at the falling edge of P(1), iv) whether or not the output P(3) is allocatable after the output P(2) is determined, as shown in a case of k=3 in FIG. 4B, v) if P(3) is allocatable after P(2), the rising edge of P(3) is set at the falling edge of P(2), vi) the allocatability of P(4) after P(3) is then determined in the same manner, as shown in a case of k=4 in FIG. 4B, vii) if P(4) is NOT allocatable after P(3), whether or not P(4) is allocatable at the same timing as P(2) is determined, and viii) the allocatability of P(5) after P(3) is then determined in the same manner, as shown in a case of k=5 in FIG. 4B.

In the above described manner, the rising edges of P(1) to P(5) are arranged to minimize the total output value with a smoother change of the waveform in a wider range of time.

More practically, the following process is employed for determining the timings of the rising edges of the PWM outputs. In the following explanation, Rk represents the rising edge of the PWM output P(k), Fk represents the falling edge of the PWM output P(k), i(Fk) represents the current margin at the falling edge Fk. The current margin i(Fk) means a margin of the current, for the purpose of determining whether it is possible to add the rising edge of other PWM outputs to the falling edge of Fk. That is, if the current (i.e., height) of the other PWM output is smaller than the current margin i(Fk), the rising edge of the other PWM output can be added to the falling edge Fk.

In the actual process, the rising edge R1 of the output P1 is determined first for k=1. As shown in FIG. 4A, a start time of each of the PWM output cycles is defined as 0 (zero), and an end time of the cycle is defined as T. Therefore, the value T also represents the duration of output cycle time of PWM output. As a result, the rising edge of the PWM output P(1) for k=1 is set as R1=1. In this case, the falling edge comes to a point F1; which can be represented as a product of the duty cycle d1 and the cycle time T. Therefore, F1=d1T is stored to the PWM control circuit 2. Further, the current margin i(F1) at the falling edge F1 is stored as i(F1)=I1, which represents the current I1 of the PWM output P1.

Then, the rising edges R2 to R5 of the PWM output P2 to P5 for k=2 to 5 are respectively determined. For example, after determining the rising edge R1 for the output P1 (k=1), the allocatability of the output P2 next to the output P1 is determined. That is, if a combination of P1 and P2 fits into one cycle time T, the output P2 is allocatable next to the output P1. If the combination of P1 and P2 exceeds one cycle time T, the output P2 is not allocatable after the output P1. If the latter is the case, the output P2 should be generated at the same time as the rising edge R1 of the output P1.

When the PWM output P2 is allocated after the PWM output P1, the current margin i(F2) at the falling edge F2 is stored as the current value I2 of the PWM output P2, that is, i(F2)=I2. Further, the current margin i(F1) at the falling edge F1 is calculated by subtracting the I2 from the I1. Then, i(F1) is updated as i(F1)=I1−I2.

Then, the rising edge R3 of the PWM output P3 for k=3 is determined. R3 can be allocated at one of the following three points: (a) the falling edge F2 of the output P2, (b) the falling edge F1 of the output P1, which is in sync with the output P2, or (c) the start time 0 (zero), which is in sync with the output P1. Therefore, the allocatability of the output P3 after the output P2 is examined first, and, if P3 is not allocatable after P2, then the allocatability of P3 after P1 at the falling edge F1 in sync with P2 is examined. If P3 is not allocatable after P1, then P3 is allocated at the start time 0, in sync with P1.

In that case, whether P3 is allocatable after P2 at the falling edge F2 is determined based on the current margin i(F2). That is, whether the current value I3 of the output P3 is smaller than i(F2)=I2 is examined. Further, whether P3 is allocatable after P1 at the falling edge F1, in sync with P2, is determined based on the current margin i(F1)=I1−I2. That is, whether I3 is smaller than i(F1)=I1−I2 is examined.

The above-described determination is repeated for each of k=2 to 5. Then, the rising edge Rk having the latest timing is selected for the output Pk.

The above determination scheme can be generalized by using 'n' as the number of the circuit loads. If a suitably-allocatable rising edge Rk of the PWM output Pk is designated as a number j, the following relation 1 is used to find the greatest number of j for k=2 to n (i.e., $2 \leq k \leq n$). That is, the number j that fulfills Relation 1 in the following is used to set the falling edge Fj, which is in sync with the rising edge Rk of the output Pk, (i.e., Rk=Fj). At the same time, the falling edge Fk of the output Pk is set at a time of the duty cycle dk multiplied by the cycle time T relative to Rk (i.e., Fk=Rk+dkT). Then, the current margin i(Fk) is designated as the current value Ik (i.e., i(Fk)=Ik), and the current margin i(Fj) at the falling edge Fj of the PWM output Pk that has the rising edge Rk is calculated by subtracting the current value Ik from the previous current margin i(Fj)* (i.e., i(Fj)=i(Fj)*−Ik).

$$Fj+dkT \leq T \text{ and } i(Fj) \geq Ik \quad \text{(Relation 1)}$$

On the other hand, if there is no suitable number j that fulfills the Relation 1, the rising edge Rk is set at the start time 0 (i.e., Rk=0), and the falling edge is set to a timing Fk that is calculated as a product of the duty cycle dk and the cycle time T (i.e., Fk=dkT), and the current margin i(Fk) is set as the current value Ik (i.e., i(Fk)=Ik).

The above principle of edge calculation is summarized as follows. That is, as illustrated in FIG. 4B, for the numbers between 2 and n (i.e., $2 \leq k \leq n$), whether there is an integer j that fulfills the following relation of $1 \leq j \leq k-1$ is examined, and (a) if one or more integers j fulfilling the above Relation 1 exists, the greatest one of the integers j is used to define Rk=Fj, Fk=Rk+dkT, i(Fj)=i(Fj)*−Ik, i(Fk)=Ik, or (b) if there is no integer j fulfilling the above Relation 1, the following definitions of Rk=0, Fk=dkT, i(Fk)=Ik are employed.

（１１置換すみ）

Therefore, when the PWM outputs P1 to P5 corresponds to the outputs A to E, in the case of k=2, F1+d2T≤T and i(F1)≥I2 are both fulfilled, and j=1 is used as the greatest number of j, thereby leading to definitions of R2=F1, F2=R2+d2T, i(F1)=I1−I2 (in this case I1 takes the previous value i(F1)* relative to i(F1)), and i(F2)=I2.

Likewise, in the case of k=3, F2+d3T≤T and i(F2)≥I3 are both fulfilled, and j=2 is used as the greatest number of j, thereby leading to definitions of R3=F2, F3=R3+d3T, i(F1)=I1−I2, i(F2)=I2−I3 (in this case I2 takes the previous value i(F2)* relative to i(F2)), and i(F3)=I3.

Further, in the case of k=4, F1+d4T≤T and i(F1)≥I4 are both fulfilled, and j=1 is used as the greatest number of j, thereby leading to definitions of R4=F1, F4=R4+d4T, i(F1)=I1−I2−I4 (in this case I1−I2 takes the previous value i(F1)* relative to i(F1)), i(F2)=I2−I3, and i(F3)=I3.

Furthermore, in the case of k=5, F1+d5T≤T and i(F1)≥I5 are both fulfilled, and j=1 is used as the greatest number of j, thereby leading to definitions of R5=F1, F5=R5+d5T, i(F1)=I1−I2−I4−I5 (in this case I1−I2−I4 takes the previous value i(F1)* relative to i(F1)), i(F2)=I2−I3, and i(F3)=I3.

Figure 5:
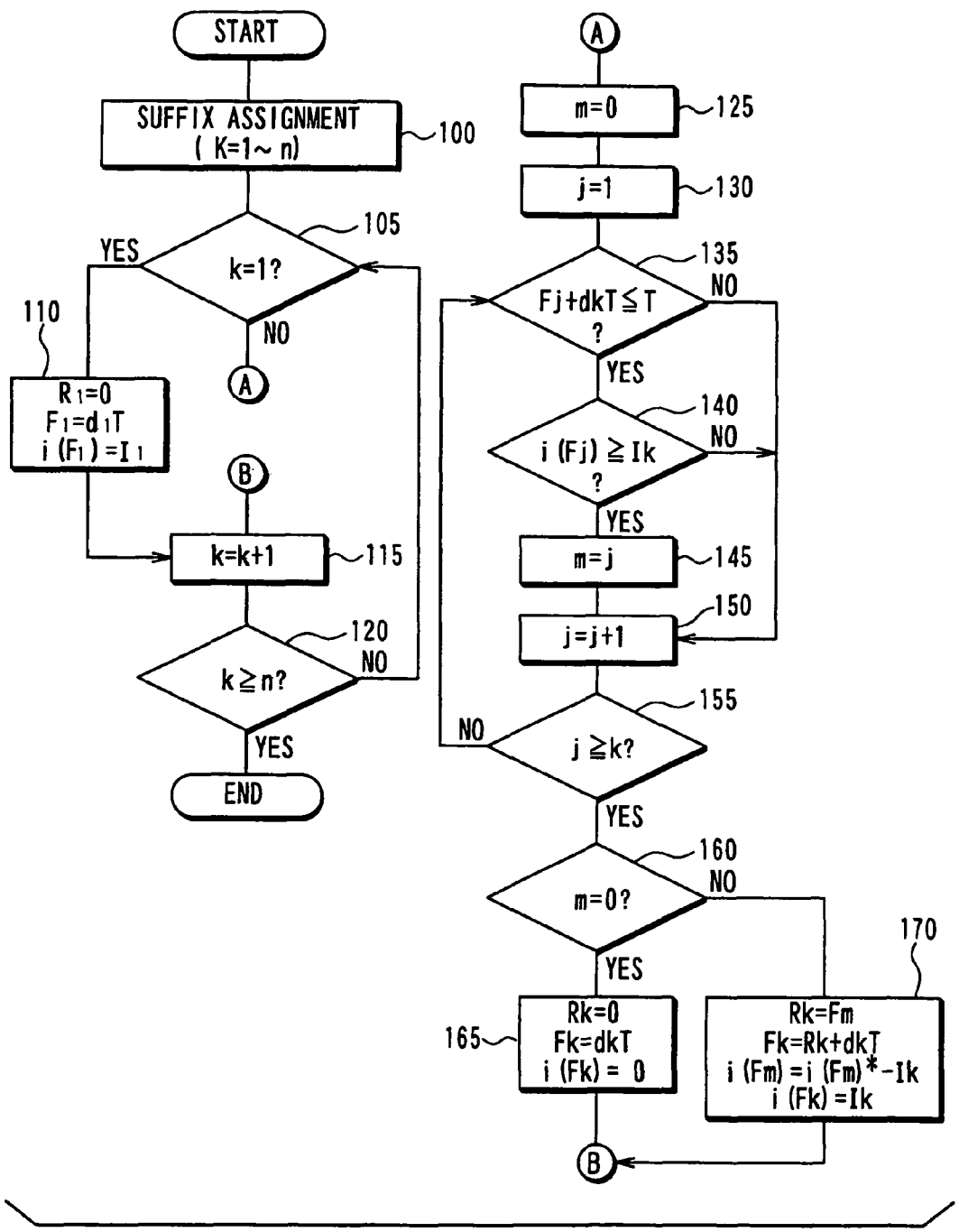
FIG. 5 is a flowchart of a timing setting process of the PWM outputs.

FIG. 5 is a flowchart of a timing setting process of the PWM outputs. That is, timings of the rising edges and the falling edges of the PWM outputs are set by this process. This process is performed in a certain calculation cycle whenever the PWM outputs are changed, for example. The steps in the flowchart shown in FIG. 5 correspond to respective means for performing the explained process contents.

First, at step 100, the suffix k is assigned. In the assignment process, the priority order according to the current is determined. When there are n pieces of circuit loads and the PWM output is designated as Pk, the suffix k takes the assigned values of 1 to n.

At step 105, whether k=1 or not is determined. If it is the first time of determination after the change of the PWM output, the suffix k is initialized as k=1, corresponding to YES at 105, thus followed by step 110 defining R1=0, F1=d1T, i(F1)=I1, and the process proceeds to step 115. Then, k is incremented by 1 (i.e., k=k+1). Then, at step 120, it is determined whether k is equal to or greater than n. If k is smaller than n, the process keeps returning to step 105, until k becomes equal to or greater than n.

When the process proceeds to step 105 next time, the suffix k has the value 2 (i.e., k=2), corresponding to NO at 105, thereby proceeding to step 125. Then, at step 125, m is initialized to 0 (zero), and step 130 follows, where j is set to 1 (i.e., j=1). In this case, m represents the maximum number of integer j, thereby taking a positive integer value.

Then, at step 135, whether Fj+dkT≤T is fulfilled is determined, and then whether i(Fj)≥Ik is fulfilled is determined at step 140. If both of steps 135 and 140 are affirmative (i.e., YES), the process proceeds to step 145 for the update of m=j, and then proceed to step 150. If at least one of steps 135 and 140 is not fulfilled (i.e., NO), the process proceeds to step 150 without the updating of m.

Then, at step 150, the integer j is incremented to j+1 (i.e., j=j+1), and the process proceeds to step 155, for the determination if j≥k is fulfilled. That is, for each of the integers j between 1 and k−1, fulfillment of Fj+dkT≤T and i(Fj)≥Ik are examined, and the integer j is incremented if those conditions are fulfilled. In this manner, the maximum value m of the integer j is determined.

Then, at step 160, whether m is equal to 0 is determined. If it is affirmative (i.e., YES), the process proceeds to step 165, defining Rk=0, Fk=dkT, and i(Fk)=0. Then, the process proceeds to step 115. If step 160 is negative (i.e., NO), the process proceeds to step 170, defining Rk=Fm, Fk=Rk+dkT, i(Fm)=i(Fm)*−Ik, and i(Fk)=Ik.

Because the above process is repeated until k becomes equal to or greater than n, the rising edges Rk and the falling edges Fk of the PWM outputs Pk are set for all cases of k between 1 to n.

Figure 6B:
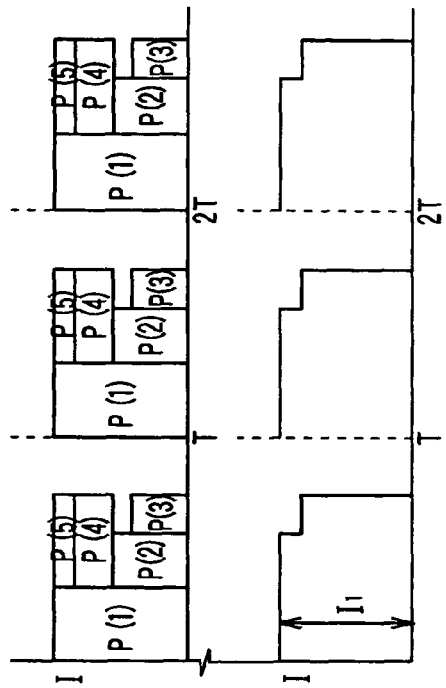
FIGS. 6A and 6B are illustrations of output waveforms showing ON/OFF timings of respective PWM outputs according to rising/falling edge timing settings and total current outputs of PWM outputs.
Figure 6A:
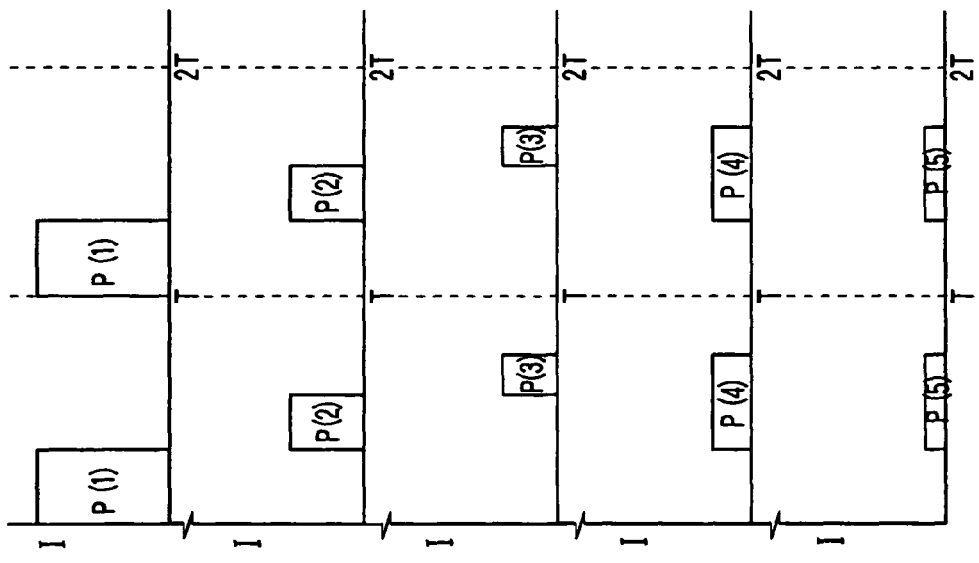
Figure 7:
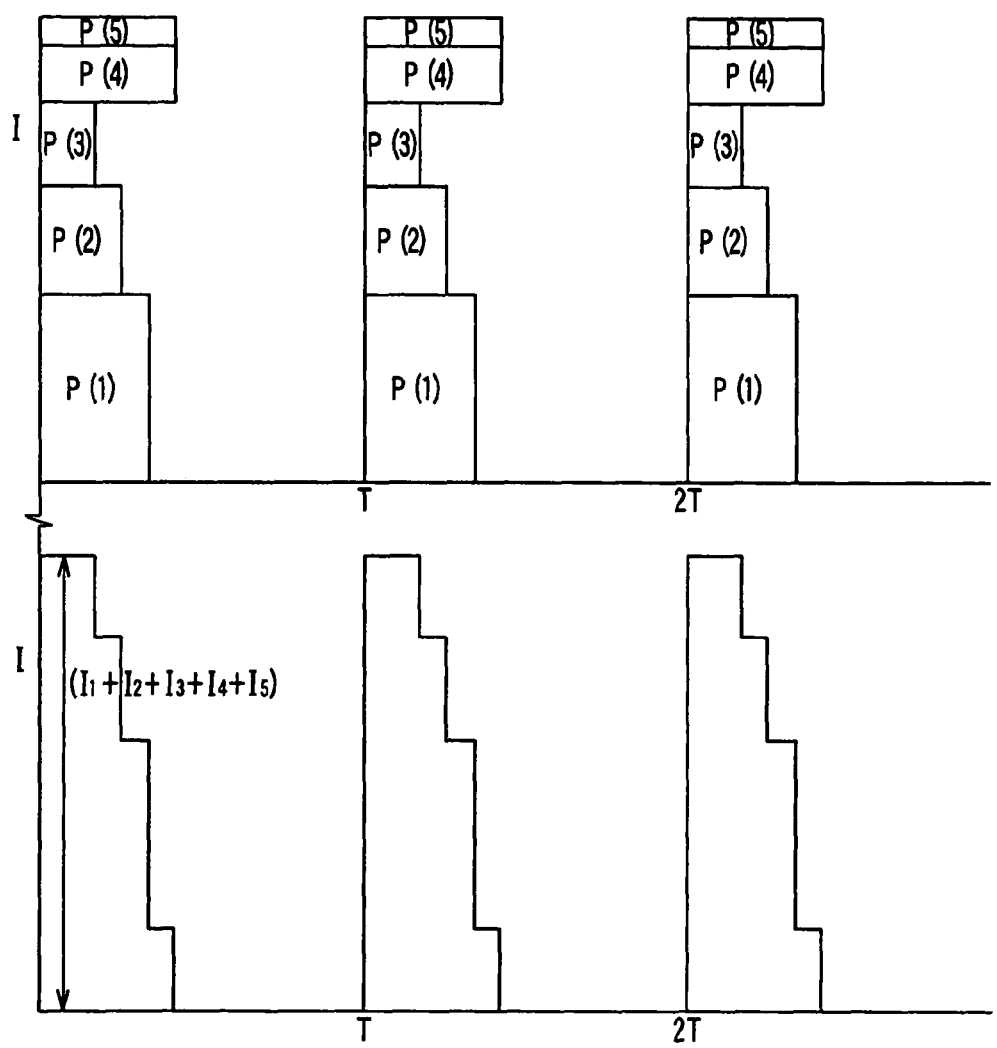
FIG. 7 is an illustration of total current outputs of PWM outputs by a conventional waveform superposition scheme.

After setting the rising edges Rk and falling edges Fk of the PWM outputs Pk as described above, the ON-OFF timing of each of the PWM outputs is positioned as illustrated in FIG. 6A. Therefore, a total current of each cycle can be calculated as a sum of the respective pulses as shown in FIG. 6B. That is, the respective pulses are piled up as shown in the illustration of the upper portion of FIG. 6B, and the waveform resulting from the piling of the respective pulses takes a shape of the lower portion of illustration in FIG. 6B. As a result, the temporal change of the current is controlled under a current I1 in this arrangement of the outputs P1 to P5. This is advantageous against the arrangement of the outputs P1 to P5 in the illustration of FIG. 7, which has all the five rising edges R1 to R5 set in sync at the start time 0. The arrangement of the outputs P1 to P5 illustrated in FIG. 7 has, as the temporal change of the current, the simple sum of the currents I1 to I5, and the resulting waveform has a steep rise and fall.

In other words, by the arrangement of the rising edges of respective PWM outputs Pk, the total electric current of the multiple outputs Pk can be reduced. Therefore, the temporal change of the current size takes a smaller value, thereby enabling a reduction of the radiation noise. As a result, the waveform shaping is not required in the course of generating the PWM outputs, or waveform shaping can be simplified in terms of radiation noise reduction. That is, the power loss due to the waveform shaping is reduced, thereby reducing the heat dissipation caused by the power loss.

The above operation scheme is also advantageous because it is free from channel number limitation. That is, regardless of the number of output channels, or, in other words, regardless of the number of PWM driven loads, the rising edge Rk of the output Pk can be arranged. Therefore, the PWM control apparatus is free from the restriction of PWM driven load number.

(Other Embodiments)

Although the present disclosure has been fully described in connection with preferred embodiment thereof with reference to the accompanying drawings, it is to be noted that various changes and modifications will become apparent to those skilled in the art.

For example, the number of output channels in the PWM control circuit 2 may be different from 5. That is, when the number of output channels is 2 or more, the rising edges Rk of the respective outputs can be arranged in the above-described manner.

Further, though the PWM outputs are considered as pulse currents in the above embodiment, the PWM outputs may be considered as pulse voltages. In that case, the pulse voltage is used as the the PWM output Pk, and the voltage margin is used in place of the current margin i(Fk) for determining the margin of the PWM outputs.

Such changes, modifications, and summarized schemes are to be understood as being within the scope of the present disclosure as defined by appended claims.

What is claimed is:

1. A PWM control apparatus for periodically providing pulse outputs as PWM outputs for loads, each of the loads driven by PWM driving scheme in each of multiple channels after generating respectively different PWM outputs for the multiple channels, the apparatus comprising:

an assignment unit for assigning priority to respective PWM outputs in the multiple channels according to an amplitude of each of the PWM outputs;

a first unit (a) for setting, as a start time of a cycle time of the pulse output, a rising edge of a first PWM output that has a top priority assigned by the assignment unit, and (b) for setting, as a falling edge of the first PWM output, at a timing of a pulse width length multiplied by the cycle time of the pulse output relative to the start time of the cycle time, and (c) for setting, as an amplitude of the PWM output, an output margin at the falling edge of the first PWM output; and a second unit for setting, as a rising edge of a second PWM output that has a second-place priority assigned by the assignment unit, (a) the falling edge of the first PWM output if the amplitude of the second PWM output is smaller than the output margin at the falling edge of the first PWM output, or (b) the start time of the cycle time if the amplitude of the second PWM output is greater than the output margin at the falling edge of the first PWM output.

2. The PWM control apparatus of claim 1, wherein the second unit sets the falling edge of the second PWM output at a timing of a product of the second PWM output and the cycle time relative to the falling edge of the first PWM output, if the amplitude of the second PWM output is smaller than the output margin at the falling edge of the first PWM output, the second unit sets the output margin at the falling edge of the second PWM output as the amplitude of the second PWM output, and the second unit updates the output margin at the falling edge of the first PWM output to a difference value between the amplitude of the first PWM output and the second PWM output.

3. The PWM control apparatus of claim 2, wherein, in a circumstance that the rising edge of the second PWM output is set at the falling edge of the first PWM output, the second unit sets the rising edge of a third PWM output that has a third-place priority assigned by the assignment unit at the falling edge of the second PWM output if the amplitude of the third PWM output is smaller than the output margin at the falling edge of the second PWM output, and if the amplitude of the third PWM output is greater than the output margin at the falling edge of the second PWM output, the second unit sets the rising edge of the third PWM output at the falling edge of the first PWM output when the updated output margin at the falling edge of the first PWM output is smaller than the amplitude of the third PWM output, or the second unit sets the rising edge of the third PWM output at the start time of the cycle time when the updated output margin at the falling edge of the first PWM output is greater than the amplitude of the third PWM output.

4. The PWM control apparatus of claim 3, wherein if the amplitude of the third PWM output is smaller than the output margin at the falling edge of the second PWM output, the second unit sets the output margin at the falling edge of the third PWM output as the amplitude of the third PWM output, and updates the output margin at the falling edge of the second PWM output to a difference value between the amplitude of the second PWM output and the third PWM output, and if the amplitude of the third PWM output is greater than the output margin at the falling edge of the second PWM output and smaller than an already-updated output margin at the falling edge of the first PWM output, the second unit updates the already-updated output margin at the falling edge of the first PWM output further to a difference value between the already-updated output margin at the falling edge of the first PWM output and the amplitude of the third PWM output.

5. A method of controlling multiple outputs in pulse width modulation comprising:

defining each of multiple outputs by a time width and a height size of a rectangular pulse shape;

assigning output priorities to multiple outputs according to respective height sizes of the multiple outputs; and arranging multiple outputs into one cycle time of the output according to the output priorities, wherein the multiple outputs are arranged timewisely according to the output priority within the one cycle time in a first round, and the remain of the multiple outputs are also arranged timewisely at a latest falling edge of an already-arranged output to fit in the one cycle time in subsequent rounds for achieving a smallest total height size of the multiple outputs.

* * * * *